United States Patent
Seth et al.

(10) Patent No.: US 7,471,111 B2
(45) Date of Patent: Dec. 30, 2008

(54) SLEW-RATE CONTROLLED PAD DRIVER IN DIGITAL CMOS PROCESS USING PARASITIC DEVICE CAP

(75) Inventors: Sumantra Seth, Bangalore (IN); Ankush Goel, Chandiagarh (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/696,247

(22) Filed: Apr. 4, 2007

(65) Prior Publication Data

US 2008/0246512 A1 Oct. 9, 2008

(51) Int. Cl.
*H03K 19/094* (2006.01)

(52) U.S. Cl. .......................... 326/83; 326/87

(58) Field of Classification Search .............. 326/82, 326/83, 86, 87, 26, 27, 31, 34
See application file for complete search history.

(56) References Cited

U.S. PATENT DOCUMENTS

2001/0045508 A1* 11/2001 Dierickx .................. 250/208.1
2004/0165449 A1* 8/2004 Pan ....................... 365/189.05

* cited by examiner

*Primary Examiner*—James H. Cho
*Assistant Examiner*—Thienvu V Tran
(74) *Attorney, Agent, or Firm*—Warren L. Franz; Wade J. Brady, III; Frederick J. Telecky, Jr.

(57) ABSTRACT

A slew-rate controlled driver circuit in an integrated circuit fabricated in a low voltage CMOS process, having an input node and an output node. A PMOS pull-up transistor is provided, having a source connected to one side of a power supply, having a gate, and having a drain connected to the output node. The PMOS transistor also has a parasitic capacitance between its gate and drain, having a value that may vary from one integrated circuit to the next from process variations and in response to varying circuit conditions. A current source generates a current having a level corresponding to the value of the parasitic capacitance, and to provide that current to the gate of the PMOS transistor. A level shifter receives an input signal having a voltage varying in a first range provides as output signal to the gate of the PMOS transistor shifted to a level suitable for the PMOS transistor. An NMOS pull-down transistor is also provided, connected to the other side of the power supply, with a similar and corresponding current source and level shifter as has the PMOS transistor.

4 Claims, 5 Drawing Sheets

SLEW-RATE CONTROLLED PAD DRIVER IN DIGITAL CMOS PROCESS USING PARASITIC DEVICE CAP

TECHNICAL FIELD OF THE INVENTION

The present invention relates to slew-rate controlled driver circuits, and more particularly relates to such drivers in low voltage CMOS processes.

BACKGROUND OF THE INVENTION

In many general purpose input/output interfaces, such as USB Multimedia Card I/O (MMCIO), it is required to provide, via CMOS circuitry, a signal that varies between 0 volts and 3.3 volts and has a controlled rise/fall time to reduce electromagnetic interference (EMI) and supply/ground noise. However, deep submicron technology scales transistor voltages, for example by scaling down threshold voltage, $V_T$, and increasing drive to have a lower gate-to-source voltage ("VGS"), supporting lower supply voltages. This creates a challenge for high-speed I/O circuit designs that require a high output voltage swing.

Figure 1A:
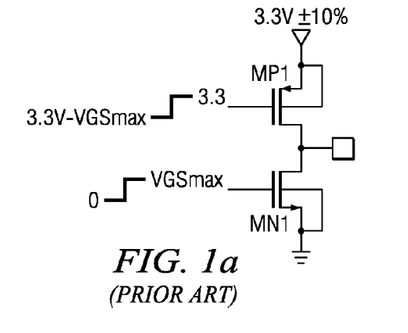
FIG. 1(a) is a diagram showing a basic prior art driver.

FIG. 1(a) shows basic driver structures and the voltage level the driver transistors need to tolerate. FIG. 1(a) shows a simple driver with single PMOS transistor device MP1 and NMOS transistor device MN1 as driver transistors. The gate of device MP1 in this case should be driven by a voltage that varies between a low of 3.3 volts minus the maximum VGS for which the device is rated ("VGSmax"), and a high of 3.3 volts, and should support a gate-to-drain maximum voltage ("VGDmax") and drain-to-source maximum voltage ("VDSmax") of 3.3V. The gate of device MN1 should be driven by levels that vary from 0 to VGSmax. Device MN1 also needs to support a gate-to-drain voltage ("VGD"), VDS, and a drain substrate reverse voltage VDB of 3.3V. A 3.3V supply usually has a variation of +/−10%, and therefore the junctions may need to tolerate 10% higher voltage than the nominal supply condition, depending on the application.

Figure 1B:
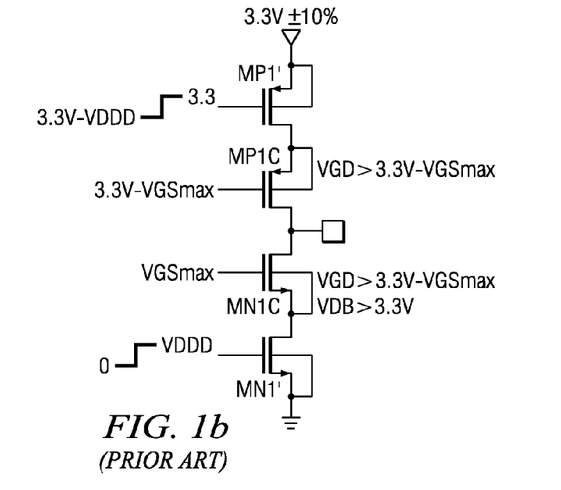
FIG. 1(b) is a diagram showing a prior art cascoded driver.

FIG. 1(b) shows a cascoded driver circuit, where devices MP1' and MN1' are protected by cascade PMOS and NMOS devices MP1C and MN1C, respectively. Therefore, in this circuit we can use low voltage transistors, henceforth referred as core transistors, as devices MP1' and MN1'. Devices MP1C and MN1C should be biased according to their voltage ratings, but in this case also MP1C and MN1C should not be core transistors. In present day CMOS processes, one can have I/O transistor devices with higher VDS, VGD and VDB support by extending the drain region, hereinafter referred to as drain extended transistors ("DETs"), but the limiting voltage for such devices is VGSmax, as it is dependent on the gate oxide thickness. Accordingly, it would be desirable to use the simple architecture shown in FIG. 1(a), if it were possible to limit the VGS and have a simple slew control mechanism.

SUMMARY OF THE INVENTION

The present invention is a slew-rate controlled driver circuit in an integrated circuit fabricated in a low voltage CMOS process, having an input node and an output node. A PMOS pull-up transistor is provided, having a source connected to one side of a power supply, having a gate, and having a drain connected to the output node. The PMOS transistor also has a parasitic capacitance between its gate and drain, having a value that may vary from one integrated circuit to the next from process variations and in response to varying circuit conditions. A current source generates a current having a level corresponding to the value of the parasitic capacitance, and to provide that current to the gate of the PMOS transistor. A level shifter receives an input signal having a voltage varying in a first range provides as output signal to the gate of the PMOS transistor shifted to a level suitable for the PMOS transistor. An NMOS pull-down transistor is also provided, connected to the other side of the power supply, with a similar and corresponding current source and level shifter as has the PMOS transistor.

In some embodiments, clamping transistors are connected to the gates of the PMOS and NMOS transistors. In some embodiments, the current sources are switched capacitor current generators, generating a current that corresponds to a drain-to-gate capacitance of an MOS transistor of the same type as the transistor to the gate of which it is providing current.

These and other aspects and features of the invention will be apparent to those skilled in the art from the following detailed description of the invention, taken together with the accompanying drawings.

DETAILED DESCRIPTION OF THE PREFERRED EMBODIMENT

The making and use of the various embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not limit the scope of the invention.

Prior to the detailed disclosure of specific embodiments of the invention, a brief discussion follows of additional background that places the novelty and benefits of the invention in better context.

Figure 2A:
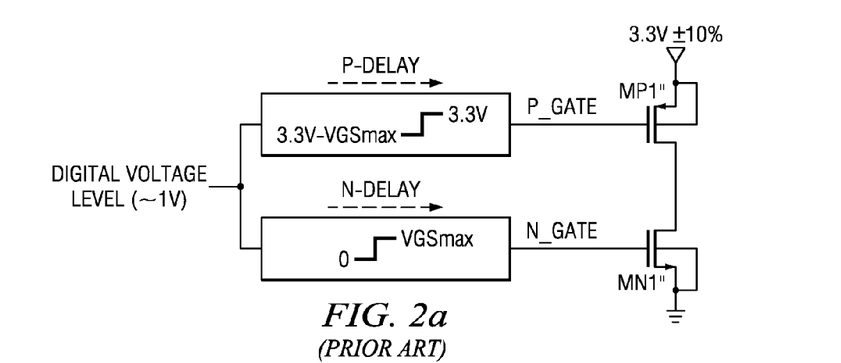
FIG. 2(a) is a diagram showing a simple pad driver.
Figure 2B:
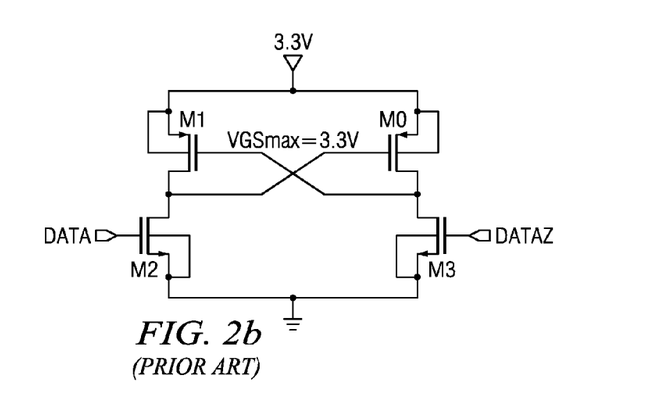
FIG. 2(b) is a diagram showing a CMOS level shifter.

FIG. 2(a) shows the basic architecture of a simple pad driver, implemented in an integrated circuit fabricated using a low voltage semiconductor process. The N-delay path of the input signal to NMOS device MN1" and the P-delay path of the input signal to PMOS device MP1" are preferably matched, to minimize the through current and duty cycle distortion. The delay variation is more dominant in ultra deep submicron, low voltage digital processes, as the input digital logic level is in the sub 1V range, and the output driver cannot be driven merely by a level shifter which shifts a low voltage digital signal to a 0-3.3V signal, because there is no transistor in such technology which can support a VGS of 3.3V. This problem can be seen more clearly by reference to the conventional, prior art level shifter circuit shown in FIG. 2(b). In this circuit, transistors M0 and M1 need to support 3.3V across VGS, VGD and VDS. Hence, conventional level shifters cannot be used in ultra deep submicron technologies with lower VGS transistors. This makes it difficult to match the N-path delay with the P-path delay, as the voltage level requirements of both the paths are different.

Another problem with CMOS drivers is the variation of slew rate with Process (P), supply voltage (V) and temperature (T) (henceforth referred as PVT). Rise and Fall time, or, slew=$dV_{out}/dt$, control of I/O signals is very important as it potentially is a major contributor to noise on the supply and ground lines. Very fast rise and fall times also affect electromagnetic interference ("EMI"), as well as signal reflection while driving a long cable, creating signal integrity problems in high speed serial data communication.

There are circuit designs mentioned in the prior art that include measures for the control of I/O rise and fall times. One example is disclosed in *Design Guide for a Low Speed Buffer for the Universal Serial Bus*, Intel Corporation, Rev. 1.1, December 1996. However, the amplifier-based feedback approach discussed in this reference is not suitable for high speed applications, and it has an undesirable silicon area and power impact as data rate is increased.

Figure 3:
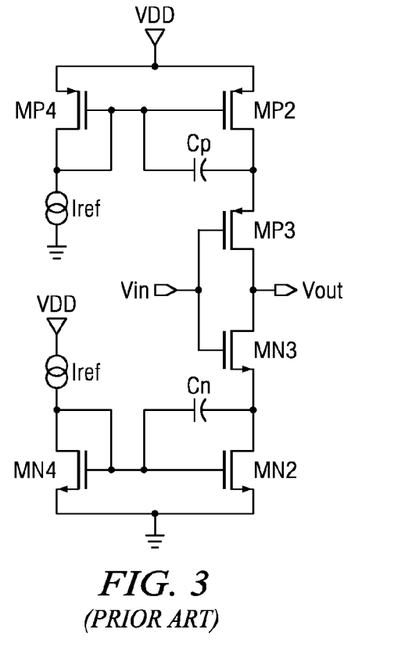
FIG. 3 is a diagram showing a CMOS driver.

FIG. 3 shows the topology of another example, disclosed in "A Robust Load Insensitive Pad Driver", by Ahmad B. Dowlatabadi, IEEE Journal of Solid State Circuits, vol. 35, pages 660-665, April 2000. However, this topology has not been implemented with 1.8V transistors, and is not area efficient because of the large feedback capacitors Cp and Cn, as well as the series switches implemented as transistors MN3 and MP3. In addition, these switching transistors minimize the effect of the feedback slew control, as they can remain in saturation for a relatively long time during rise/fall time. This is due to the fact that a 1.8V VGS transistor cannot drive a rail to rail signal that is equal to the output swing as the VGS of switching transistors, MP3 and MN3. Therefore the series transistor gives a cascoding effect and reduces the effect of feedback capacitor on slew rate control, causing rise/fall time mismatches across PVT. If the feedback capacitor is not present in the circuit, then the driver simply becomes a constant current driver, hence the output slew rate is proportional to the pad capacitance until transistor MN2 remains in saturation. The scheme discussed in the Dowlatabadi article cannot be implemented in ultra deep submicron technologies, as the output pad cannot be sensed directly with lower VGS transistors. Hence, it is not possible to implement the feedback amplifier from the pad in a simple way.

By contrast, the topology mentioned in "Design of a Slew Rate Controlled Output Buffer", by F. Gracia. et. al, ASIC Conference 1998, pages 147-150, is not PVT independent and the large variation in rise/fall time, caused by threshold voltage, $V_T$, drive and feedback capacitance variations, may not be acceptable in some I/O specifications. Further, the scheme mentioned in "A Slew-Rate Controlled Output Driver Using PLL as compensation circuit", by Soon-Kyun Shin et. al, IEEE Journal of Solid State Circuits, vol. 38, pages 1227-1233, July 2003, uses a staged pre driver and PLL to generate a constant delay. This is complicated and results in a silicon area penalty in low voltage CMOS technologies, as the PMOS and NMOS driver transistors must be driven separately with different types of level shifters. The references "High Voltage Tolerant I/O Buffers with Low Voltage CMOS Process", by Gajendra P. Singh, IEEE Journal of Solid State Circuits, vol. 34, pages 1512-1525, Nov. 1999, and "5.5V Tolerant I/O in a 2.5V 0.25 um CMOS Technology", by Anne-Johan Annema et. al, IEEE Custom Integrated Circuits Conference, 200, pages 417-420, mention high voltage drivers in low voltage CMOS processes, but without slew rate control.

We have invented an elegantly simple slew rate control driver circuit that requires a smaller silicon area, compared to other slew rate control drivers with similar transistors. Embodiments of the driver circuit can compensate the variation of circuit conditions, such as the transistor process corner and supply voltage, and are tolerant to load cap variations. Embodiments of the driver circuit may be made completely process compensated by a novel reference current generation scheme, discussed herein.

Figure 4A:
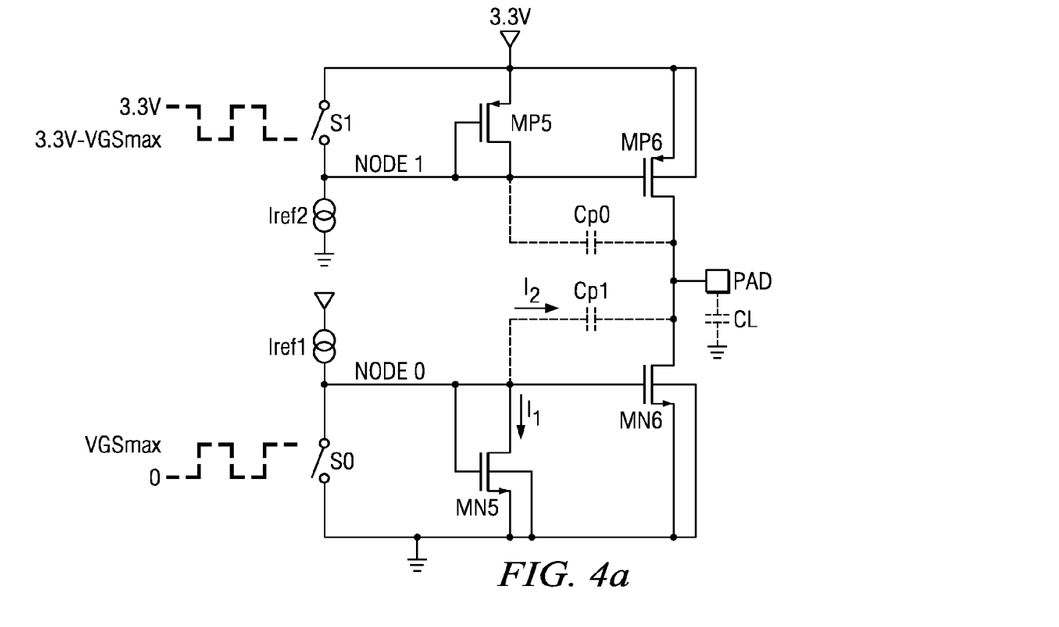
FIG. 4(a) is a diagram of an embodiment of a driver designed according to the inventive principles.
Figure 4B:
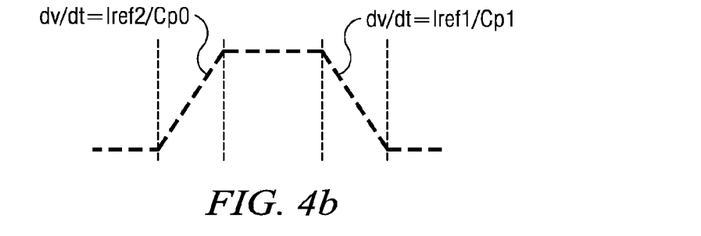
FIG. 4(b) is a graph of desired drive levels for switches S0 and S1 in FIG. 4(a).

FIG. 4(a) shows an embodiment implementing an architecture which uses drain extended transistors as the main driving transistors. The specific values of the voltages discussed are exemplary, and not intended to limit the scope of the invention, but are representative of a low voltage environment suitable for application of the inventive principles. The disclosed embodiment does not need a feedback capacitor, as it uses a parasitic Cgd capacitor, usually considered to be an undesired effect, for slew control, without any additional area being required for a feedback capacitor, as compared to other capacitor-based feedback architectures mentioned in the prior art. The rise and fall time matching is only controlled by the Cgd matching of the NMOS and PMOS transistors, and Iref1 and Iref2. In most I/O specifications rise/fall time matching is not of great concern, but in some applications it is. On the other hand, accurate slew control is a frequent requirement.

The following is a description of an embodiment of the inventive driver circuit that is single ended, but for differential output the routineer in the art can readily design a circuit having two branches, and drive them using differential digital signals. In FIG. 4(a), currents Iref1 and Iref2 are DC currents, capacitors Cp0 and Cp1 are the CGD parasitic capacitances of transistors MP6 and MN6, respectively. Transistors MN5 and MP5 are used as clamping transistors to limit the VGS of transistors MN6 and MP6 within the specified VGSmax. Switches S0 and S1 are used to switch ON/OFF the main driving transistors. Transistors for switches S0 and S1, implemented as NMOS and PMOS devices, respectively, should be driven by levels as shown in FIG. 4(a), i.e., switch S0 being driven by a signal varying between 0 and VGSmax, and switch S1 being driven by a signal that varies between 3.3V3–VGSmax and 3.3V, so that the specified VGS limit is never exceeded. A drain extended transistor is not needed for either of switches S0 and S1. Switches S0 and S1 should support VDSmax>=VGSmax for transistors MP6 and MN6, respectively.

The architecture of the circuit of FIG. 4(a) uses the output transistors MP6 and MN6 as switches to tristate the output. The output transistors, MP6 and MN6, are designed to support a VGD greater than the signal swing in this case. In some processes, the output transistors may be replaced by low voltage drain extended transistors, if VGD support of 3.3V is assured; otherwise high voltage drain extended I/O transistors should be used with VGD, VDS support of 3.3V.

Capacitors Cp1 and Cp0 are the CGD parasitic capacitances of transistors MN6 and MP6, respectively, as previously mentioned. The CGD capacitor density of drain extended devices MN1 and MP1 is generally high in ultra deep submicron technologies. This is used to advantage in the invention.

The topology of the invention utilizes the principle of feedback. For example, considering the circuit of FIG. 4(a), transistor MN6 is a common source stage and its CGD capacitance is a feedback element. The output slope creates a current equal to Cp1(dv/dt) in the feedback capacitance. The high loop gain, provided by transistor MN6 as the primary gain stage, ensures that this current is equal to the constant current Iref1. Therefore, dv/dt is approximately equal to Iref1/Cp1.

The bandwidth limitation of the output stage, determined by the load capacitance, and the error current through the diode connected clamping transistor MN5, causes deviation from the ideal slew rate of Iref1/Cp1. The following explanation describes the non-idealities and the effect of them on the output rise/fall time.

Figure 5:
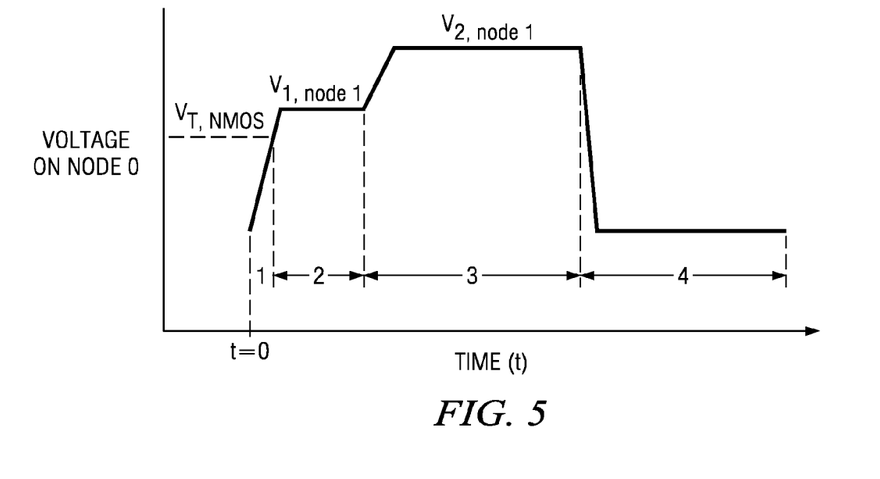
FIG. 5 is a graph of the voltage at node 0 in FIG. 5, versus time.

Referring now to the driver circuit of FIG. 4(a), and to the graph of the voltage on node 0 of the driver circuit against time, shown in FIG. 5, assume the NMOS transistor MN6 is active, and the driver is driving zero (low). Assume also that for t<0, transistor MP6 is ON and capacitance $C_L$ is pulled up to 3.3V. At t=0, switch S1 is closed so that the voltage on node 1 is pulled up to 3.3V, and thus PMOS transistor MP6 is turned OFF, switch S0 is opened and switching current Iref1 starts charging node 0, as shown in FIG. 5.

Now, consider the waveform in region 1 of FIG. 5. In this region, the current Iref1 charges node 0 to a voltage $V_{T,NMOS}$, after which the NMOS transistors MN5 and MN6 leave the cutoff region, assuming the $V_T$ of both the NMOS transistors to be same, and the voltage waveform on node 0 enters region 2. In region 2, the node 0 voltage keeps rising till it reaches $V_{1,node1}$. In region 2, transistor MN6 starts behaving like a gain stage, and the constant voltage in region 2 represents the maximum loop gain condition. Most of the time in region 2, the voltage at node 0 remains constant and a drain current $I_{out}$ discharges the load capacitor $C_L$. Expressing this mathematically, the following analysis holds true once the node 0 voltage reaches the value $V_{1,node1}$. Continuing to refer to the circuit diagram shown in FIG. 4(a):

$$Iref1 = i1+i2, \qquad \text{Eq. (1)}$$

$$\frac{I_{out}}{C_L} = \frac{i2}{Cp1}, \text{ and} \qquad \text{Eq. (2)}$$

$$I_{out} = C_L\left(\frac{3.3V}{t_{fall}}\right). \qquad \text{Eq. (3)}$$

where $t_{fall}$ is the total time it takes to discharge the $C_{out}$ from 3.3V to 0V. Also:

$$I_{out} = K_{MN1}(V_{1,node1} - V_{T,MN1})^2, \text{ and} \qquad \text{Eq. (4)}$$

$$i1 = K_{MN0}(V_{1,node1} - V_{T,MN0})^2, \qquad \text{Eq. (5)}$$

where $K_{MN0}$ and $K_{MN1}$ are the gain factors for transistors MN0 and MN1, respectively.

If the threshold voltage of transistor MN1, $V_{T,MN1}$, is equal to the threshold voltage of transistor MN0, $V_{T,MN0}$, then using Equations (4) and (5) gives $$\frac{I_{out}}{K_{MN1}} = \frac{i1}{K_{MN0}}. \qquad \text{Eq. (6)}$$

Substituting equation (3) into (4) gives $$V_{1,node1} = \sqrt{\frac{C_L}{K_{MN1}}\left(\frac{3.3V}{t_{fall}}\right)} + V_{T,MN1}. \qquad \text{Eq. (7)}$$

Using Equations (2), (3) and (6) in Equation (1) gives $$Iref1 = \left(Cp1 + C_L\frac{K_{MN0}}{K_{MN1}}\right)\left(\frac{3.3V}{t_{fall}}\right). \qquad \text{Eq. (8)}$$

Therefore $$t_{fall} = \left(Cp1 + C_L\frac{K_{MN0}}{K_{MN1}}\right)\left(\frac{3.3V}{Iref1}\right). \qquad \text{Eq. (8a)}$$

In applying the principles of the invention, to make $t_{fall}$ substantially independent of value of $C_L$, which is desirable, since it decouples the slew rate from the load capacitance, $K_{MN0}$ should be made much less compared to $K_{MN1}$. The above analysis is done assuming $V_{1,node1}$ stays constant in the analysis region.

Now, using small signal analysis, Equation (9) gives the relation between change in node1 in region 2 with respect to output (Vout) variations.

$$v_{node1} = -v_{out}\left(\frac{g_{ds,MN6}\left(1+s\left(\frac{Cp1+C_L}{g_{ds,MN6}}\right)\right)}{g_{m,MN6}\left(1-s\frac{Cp1}{g_{m,MN6}}\right)}\right), \qquad \text{Eq. (9)}$$

where $g_{m,MN6}$ and $g_{ds,MN6}$ are the transconductance and the output conductance of transistor MN6. By designing $g_{m,MN1}>>g_{ds,MN1}$ then the change in voltage at node 0 with the change in output voltage can be made to be negligible, as this node will behave like a virtual ground, and hence the voltage at node 0 will remain almost constant in the region of the above analysis. Thus a drain extended MOS with large intrinsic gain ($g_m/g_{ds}$) will be a suitable choice for transistor MN6.

As soon as transistor MN6 enters the triode region, the loop gain diminishes. Referring again to FIG. 5, after $C_L$ is discharged to close to zero, the voltage waveform of node 0 enters region 3. In this region, the output voltage remains at zero and therefore the currents $I_{out}$ and i2 become zero. Hence, $$i1 = Iref1, \qquad \text{Eq. (10)}$$

and the voltage at node1 rises to a constant voltage given by Equation (11). This voltage should not exceed the VGSmax of transistor MN6. This sets the limit on transistor MN5 and also determines the dependency of fall time on the output load capacitor.

$$V_{2,node1} = V_{T,MN0} + \sqrt{\frac{Iref1}{K_{MN0}}} \qquad \text{Eq. (11)}$$

The voltage waveform of node1 enters region 4 when the switch S0 is closed and node 0 is pulled down to 0V.

A similar mathematical description is now presented for the case in which $C_L$ is charging from 0 to 3.3V i.e. when PMOS device MP6 is active and NMOS device MN6 is OFF. In this case:

$$t_{rise} = \left(Cp0 + Cout \frac{K_{MP0}}{K_{MP1}}\right)\left(\frac{3.3V}{Iref2}\right) \qquad \text{Eq. (12)}$$

Therefore if $$Cp0 = Cp1 \qquad \text{Eq. (12a)}$$

and $$Iref1 = Iref2 \qquad \text{Eq. (12b)}$$

and $$\frac{K_{MN0}}{K_{MN1}} = \frac{K_{MP0}}{K_{MP1}} \qquad \text{Eq. (12c)}$$

then $$t_{fall} = t_{rise} \qquad \text{Eq. (12d)}$$

Thus it can be seen that in applying the inventive principles rise and fall times may be matched. This will be explained in more detail below.

As shown in FIG. 5, region 1 is dependent on process, and the time node 0 takes to rise to $V_{T,nmos}$, may cause non-linearity at the output, but this effect is insignificant as during this time transistor MN1 is almost cut off. If 10% to 90% of the output signal consists of the signal's rise and fall times, then this non-linearity can be completely ignored. The time spent by transistors MN6 and MP6 in region 1 is dependent on their respective threshold voltage, $V_T$. Hence this could cause the P-path delay and the N-path delay to be different, in turn causing cross-over variations in the case of differential driver and duty cycle distortion in a single ended driver. However, in embodiments of the present invention, rise and fall times only depend on the process variation of the CGD capacitance, and have a second order dependency on the output cap and the error current through the clamping transistor. In many present day driver circuits, I/O rise/fall times are allowed to vary over a specified range, and so embodiments of the present invention need not be compensated for CGD variation; the capacitance variation is typically ~+/−20% with process.

Figure 6A:
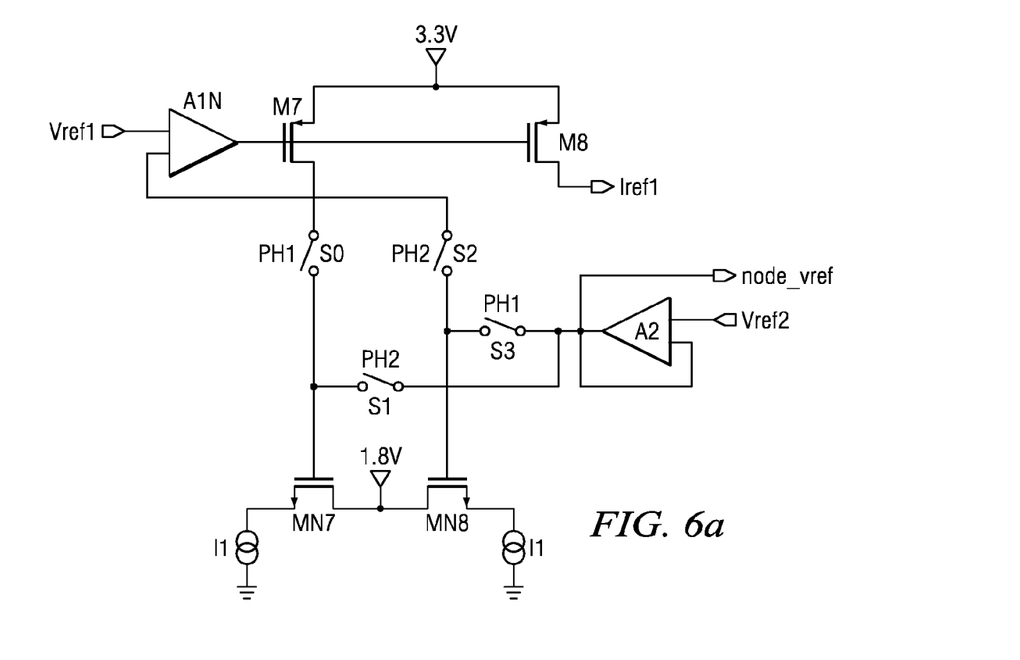
FIG. 6(a) is a diagram of an embodiment of a switch capacitor driver designed according to the inventive principles.
Figure 6B:
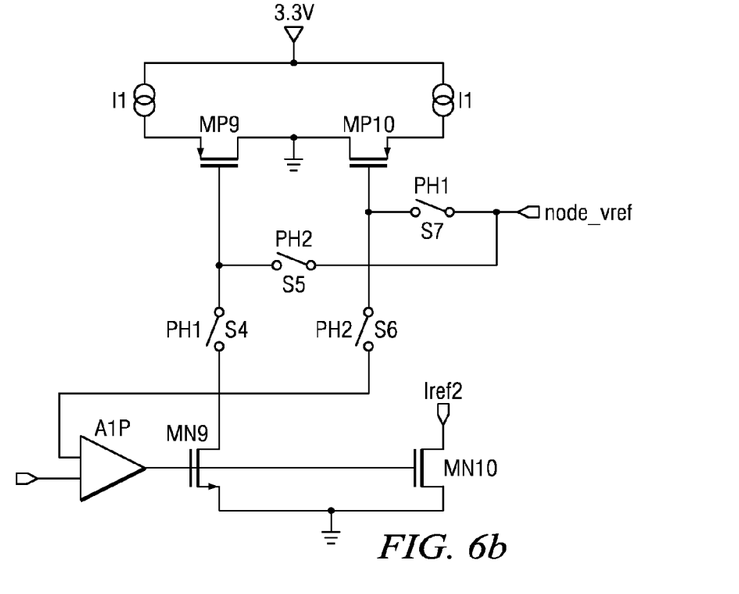
FIG. 6(b) is a diagram of another embodiment of a switch capacitor driver designed according to the inventive principles.

In a preferred embodiment of the present invention, a switched capacitor current reference circuit is used, to generate a current that varies in proportion to the CGD of the output transistors of the circuit of FIG. 4(a). Such a circuit should have a constant reference frequency clock for the clock phases used in the reference current generation. Referring now to FIGS. 6(a) and 6(b), the switched capacitor current reference circuit is shown. In the circuit, PH1 and PH2 are non-overlapping, out of phase clocks. In many applications, a constant frequency clock is available as a system clock on chip. In such cases, PH1 and PH2 may thus be generated easily. Transistors MN7 and MN8 are preferably the same type of transistors as used for the main driver, e.g., output transistor MN6 in FIG. 4(a), biased with a current I1. By maintaining transistors MN7 and MN8 in saturation, then the capacitance seen from the gate is, basically, only the gate-to-drain overlay capacitance, that is, if the overlap capacitance dominates over other parasitic capacitances. Current Iref1 generated in this scheme is proportional to $2C_{gd} \times (V_{ref1} - V_{ref2}) \times f$. Voltages Vref1 and Vref2 are constant reference voltages, and are selected to maintain transistors MN7 and MN8 in saturation. Current Iref2 may be generated as shown in FIG. 4(a), in a similar manner as described earlier.

Currents Iref1 and Iref2 may be generated using only three amplifiers by using common reference, generated by amplifier A2, as shown in FIGS. 6(a) and 6(b). Voltages Vref1 and Vref2 are preferably selected so that transistors MN7, MN8, MP7 and MP8 remain in saturation. Amplifiers A1N, A1P and A2 may advantageously be optimized for area and power, depending on the accuracy required. These reference current generators add overhead on area and power over a simple CGD driver, but this might be acceptable in high voltage I/Os in ultra deep submicron technologies, as area efficient high voltage linear capacitors are not available to be used as feedback capacitors in slew control drivers. The feedback capacitor needs to be much higher than the CGD capacitor value, so that the slew is controlled by the linear capacitance. If the inventive current generation is used, then a simple CGD driver may be made that is substantially process independent. Further, if CGD matching of similar transistors is predictable, then rise/fall matching may also be obtained using these drivers. In this regard, the dominant component is the overlap capacitance.

The considerations in selecting a value for CGD will now be described. The CGD capacitance is dominated by the overlap region of gate and drain, and in the case of high $V_{DS}$ transistors, the drain is extended by a lightly doped region. In deep submicron devices, the overlap regions are controlled. The density of the capacitor is high, as it is determined by the gate oxide thickness and the overlap region. The CGD capacitance is also high voltage tolerant. A problem with CGD capacitance is non-linearity with bias, but if it is dominated by overlap, the non-linearity is not significant for I/O driver applications. When the Cgd capacitance is compared against the VGD voltage of drain extended NMOS transistors in a typical submicron process, the capacitance is seen to be almost constant when the transistor is in saturation. This phenomenon is discussed in more detail in "CMOS Analog Circuit Design," by Phillip E. Allen & Douglas R. Holberg, Oxford University Press, Inc., $2^{nd}$ Edition, © 2002, pages 79-86.

The CGD capacitance non-linearity is not accurately modeled, but in the case of most I/O drivers the rise/fall time needs to be controlled within certain limit, and also don't require rise/fall time matching. Hence, the inventive driver is best suited for applications with no critical rise/fall time matching requirements. If rise/fall time matching is required, then reliable data for the Cgd capacitances for the process, in both NMOS devices and PMOS devices, should be carefully considered by the designer.

Figure 7A:
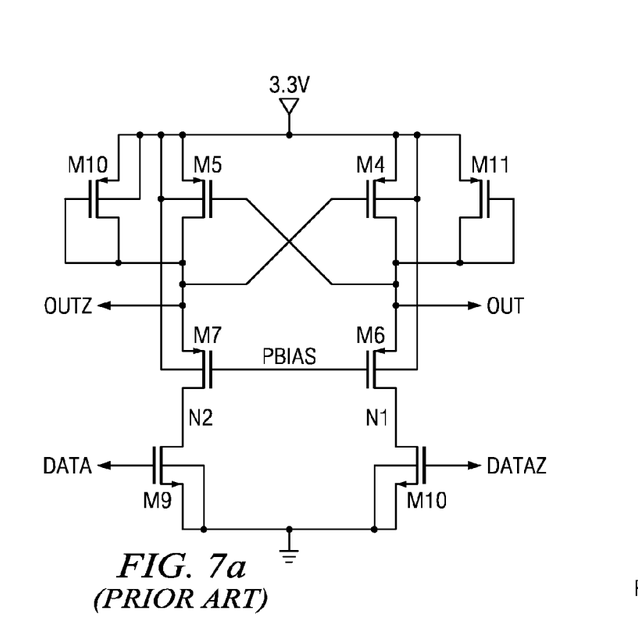
FIG. 7(a) is a diagram of an embodiment of a level shifter designed according to the inventive principles.
Figure 7B:
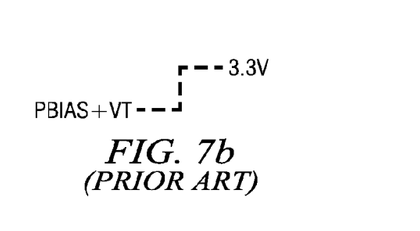
FIG. 7(b) is a graph showing voltage versus time of the output signal of the level shifter of FIG. 7(a).

FIG. 7(a) shows a level shifter which shifts the input from digital voltage level to a suitable level at the output while ensures reliability of PMOS switches, while FIG. 7(b) shows a reference plot of the output signal. The level shifter of FIG. 7(a) is suitable for use in conjunction with driving switches S0 and S1 in the circuit of FIG. 4(a). This is a known circuit, and so it will not be discussed in great detail. The output voltage level is determined by devices M6 and M7 biased at a voltage of PBIAS. The PBIAS voltage is a threshold voltage, $V_T$, less than the minimum voltage, determined by the maximum VGS of PMOS transistors used as S1 in FIG. 4(a), allowed at the output. Devices M10 and M11, configured as diodes, ensure that there is always some small current through devices M6 and M7, so that the level shifter output is $V_T$ above PBIAS. Devices M8 and M9 need to support a VDS, VGD equal to 3.3V. Level shifter design is not discussed in detail in this disclosure as this is a well known topology in the prior art, for example the Sanchez et. al. article.

Figure 8:
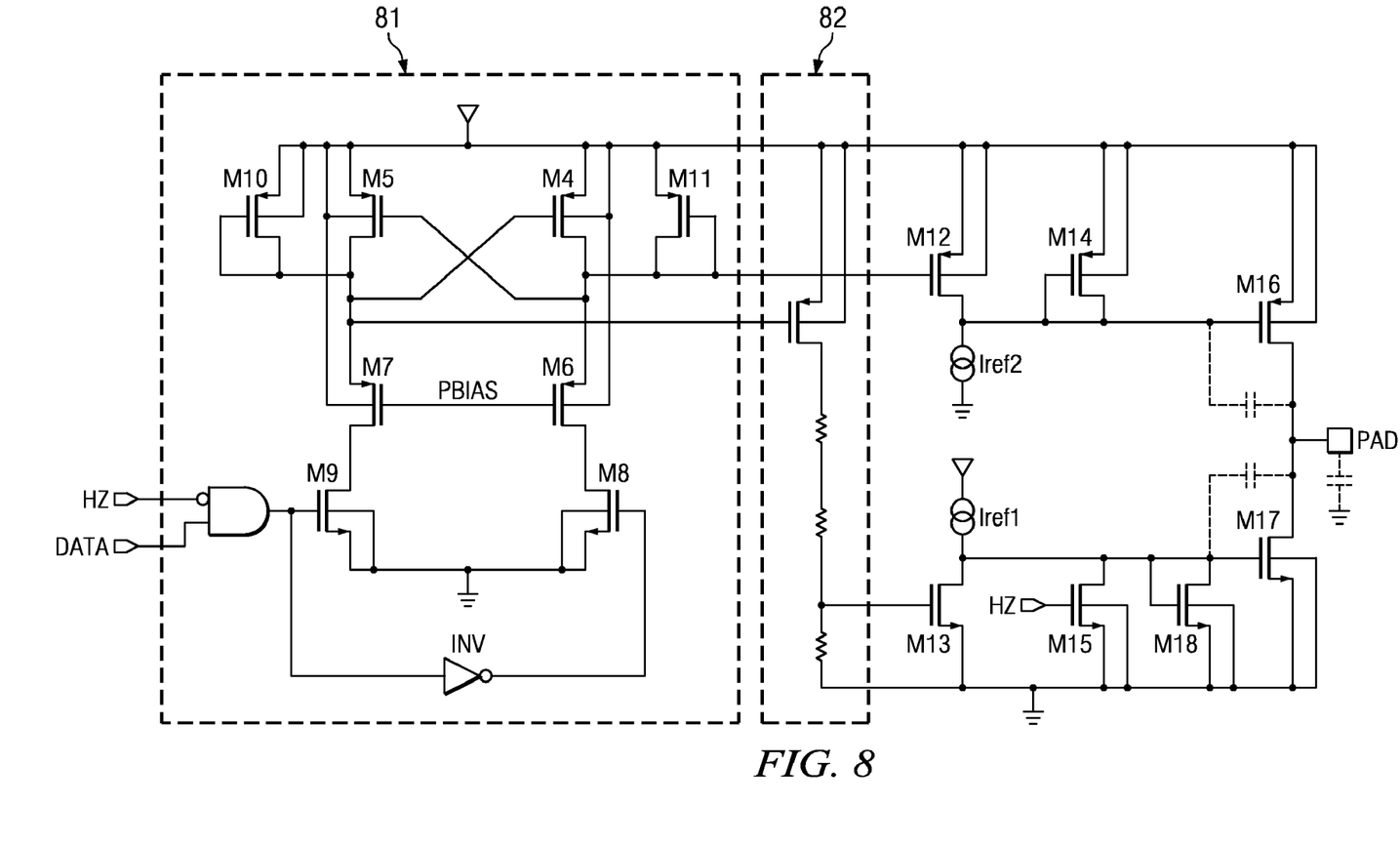
FIG. 8 is a diagram of an embodiment of a level shifter/driver designed according to the inventive principles.

FIG. 8 shows a schematic of a preferred embodiment of the present invention, showing the level shifter circuit of FIG. 7(a), in conjunction with the slew-controlled driver of FIG. 4(a). The level shifter 81 drives devices M12 and M13, which function as switches. Devices M12 and M13 should support VDSmax equal to the VGSmax of driver transistors M16 and M17, respectively. To minimize the P-delay and N-delay mismatch due to level shifting, M13 is driven by a resistive load inverter. This enables a reduction in the mismatch in path delay for the NMOS and PMOS paths. This driver could be implemented as shown in the schematic with transistors supporting maximum VGS of 1.2V and VDS support of 3.3V. Currents Iref2 and Iref1 may be generated from the reference current (=Vbg/Rext, bandgap voltage and off-chip resistors) available in SOC, if the rise/fall time variation due to CGD capacitance is acceptable. Otherwise, the CGD variation could be compensated by the switched capacitance current generation circuits of FIGS. 6(a) and 6(b), if a complete process independent solution is required, of course at the expense of the area required to design the reference.

The signal HZ is asserted when the driver needs to be tri-stated. Device M15 is used to turn off device M17 during the high impedance state of the driver. The PMOS driver transistor M16 is turned off using a logical combination of signals HZ and DATA.

We have disclosed a preferred embodiment of a driver architecture using CGD capacitance, but the inventive concept of utilizing CGD capacitance for feedback slew control could be extended to similar capacitance-based feedback schemes. For example, the invention may be advantageously applied to arrangements as described in the Intel corporation design guide and articles by Dowlatabadi, Gracia et. al. and Shin et. al., instead of using a dedicated feedback capacitor. The inventive reference current generation technique could be used to cancel CGD variation and relax the matching requirement of the CGD capacitance of the NMOS and PMOS devices.

Thus, although the present invention and its advantages have been described in detail, it should be understood that various changes, substitutions and alterations can be made herein, in addition to those mentioned above, without departing from the spirit and scope of the invention as defined by the appended claims.

What is claimed is:

1. A slew-rate controlled driver circuit in an integrated circuit fabricated in a low voltage CMOS process, having an input node and an output node, comprising:
    a PMOS transistor having a source connectable to a first one of two terminals of a power supply, having a gate, and having a drain connected to the output node, the PMOS transistor also having a first parasitic capacitance between its gate and drain, the first parasitic capacitance having a value that may vary from one integrated circuit to the next from process variations and in response to varying circuit conditions;
    an NMOS transistor having a source connectable to a second of the two terminals of the power supply, having a gate, and having a drain connected to the output node, the NMOS transistor also having a second parasitic capacitance between its gate and drain, the second parasitic capacitance having a value that may vary from one integrated circuit to the next from process variations and in response to varying circuit conditions;
    a first current source arranged to generate a first current having a level corresponding to the value of the first parasitic capacitance, and to provide the first current to the gate of the PMOS transistor;
    a second current source arranged to generate a second current having a level corresponding to the value of the second parasitic capacitance and to provide the second current to the gate of the NMOS transistor;
    a level shifter arranged to receive an input signal having a voltage varying in a first range and to provide a first output signal to the gate of the PMOS transistor varying in a second range suitable for the PMOS transistor and to provide a second output signal to the gate of the NMOS transistor varying in a third range suitable for the NMOS transistor;
    a first clamping transistor having a source connectable to the first terminal of the power supply, and having a drain and a gate both connected to the gate of the PMOS transistor; and
    a second clamping transistor having a source connectable to the second terminal of the power supply, and having a drain and a gate both connected to the gate of the NMOS transistor.

2. A slew-rate controlled driver circuit as in claim 1, wherein the first and second current sources comprise switched capacitor current generators.

3. A slew-rate controlled driver circuit in an integrated circuit fabricated in a low voltage CMOS process, having an input node and an output node, comprising:
    a PMOS transistor having a source connectable to a first one of two terminals of a power supply, having a gate, and having a drain connected to the output node, the PMOS transistor also having a first parasitic capacitance between its gate and drain, the first parasitic capacitance having a value that may vary from one integrated circuit to the next from process variations and in response to varying circuit conditions;
    an NMOS transistor having a source connectable to a second of the two terminals of the power supply, having a gate, and having a drain connected to the output node, the NMOS transistor also having a second parasitic capacitance between its gate and drain, the second parasitic capacitance having a value that may vary from one integrated circuit to the next from process variations and in response to varying circuit conditions;
    a first current source arranged to generate a first current having a level corresponding to the value of the first parasitic capacitance, and to provide the first current to the gate of the PMOS transistor;
    a second current source arranged to generate a second current having a level corresponding to the value of the second parasitic capacitance and to provide the second current to the gate of the NMOS transistor; and
    a level shifter arranged to receive an input signal having a voltage varying in a first range and to provide a first output signal to the gate of the PMOS transistor varying in a second range suitable for the PMOS transistor and to provide a second output signal to the gate of the NMOS transistor varying in a third range suitable for the NMOS transistor;

wherein the switched capacitor current generators each generate a current that corresponds to a drain-to-gate capacitance of an MOS transistor therein, wherein the MOS transistor is the same type as the transistor to the gate of which it is providing current.

4. A slew-rate controlled driver circuit as in claim 3, wherein the first and second current sources comprise switched capacitor current generators.

* * * * *